(12) United States Patent
McMenamy

(10) Patent No.: US 7,187,245 B1
(45) Date of Patent: Mar. 6, 2007

(54) AMPLITUDE CONTROL FOR CRYSTAL OSCILLATOR

(75) Inventor: Mike McMenamy, Tensed, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/949,902

(22) Filed: Sep. 24, 2004

Related U.S. Application Data

(60) Provisional application No. 60/506,265, filed on Sep. 25, 2003.

(51) Int. Cl.
 *H03B 5/32* (2006.01)
(52) U.S. Cl. .................. 331/158; 331/160; 331/183
(58) Field of Classification Search ................ 331/158, 331/183, 160, 182, 109
 See application file for complete search history.

(56) References Cited

U.S. PATENT DOCUMENTS

| | | | |
|---|---|---|---|
| 5,355,097 A | 10/1994 | Scott et al. | |
| 5,581,216 A | 12/1996 | Ruetz | |
| 5,748,048 A | 5/1998 | Moyal | |
| 5,896,069 A | 4/1999 | Williams et al. | |
| 6,025,757 A * | 2/2000 | Tsukagoshi et al. | 331/158 |
| 6,104,257 A | 8/2000 | Mann | |
| 6,140,880 A | 10/2000 | Moyal et al. | |
| 6,177,843 B1 | 1/2001 | Chou et al. | |
| 6,198,360 B1 | 3/2001 | Henrion | |
| 6,275,116 B1 | 8/2001 | Abugharbieh et al. | |
| 6,275,117 B1 | 8/2001 | Abugharbieh et al. | |
| 6,278,338 B1 * | 8/2001 | Jansson | 331/116 FE |
| 6,294,962 B1 | 9/2001 | Mar | |
| 6,326,853 B1 | 12/2001 | Moyal et al. | |
| 6,388,479 B1 | 5/2002 | Gupta et al. | |
| 6,404,294 B1 | 6/2002 | Sha et al. | |
| 6,407,641 B1 | 6/2002 | Williams et al. | |
| 6,515,551 B1 | 2/2003 | Mar et al. | |
| 6,525,616 B1 | 2/2003 | Williams | |
| 6,563,390 B1 | 5/2003 | Kizziar | |
| 6,563,391 B1 | 5/2003 | Mar | |
| 6,657,501 B1 | 12/2003 | Anil | |
| 6,657,506 B1 | 12/2003 | Maheshwari | |
| 6,667,668 B1 | 12/2003 | Henrion | |
| 6,670,852 B1 | 12/2003 | Hauck | |
| 6,690,243 B1 | 2/2004 | Henrion | |
| 6,741,137 B1 * | 5/2004 | Sibrai et al. | 331/109 |
| 6,771,136 B1 | 8/2004 | Reynolds | |
| 6,812,802 B1 * | 11/2004 | Godambe et al. | 331/183 |
| 6,825,728 B1 | 11/2004 | Beard et al. | |
| 7,005,933 B1 | 2/2006 | Shutt | |
| 2004/0113709 A1 * | 6/2004 | Sibrai et al. | 331/182 |

* cited by examiner

*Primary Examiner*—Joseph Chang
(74) *Attorney, Agent, or Firm*—Brownstein Hyatt Farber Schreck, P.C.

(57) ABSTRACT

Circuits and methods for controlling the amplitude of oscillation of a crystal. In one example, a circuit may include a peak detector; a first voltage-to-current converter; a first current-to-voltage converter coupled with the first voltage-to-current converter; a second voltage-to-current converter; a second current-to-voltage converter coupled with the second voltage-to-current converter; and a differential amplifier; wherein a ratio between a size of first voltage-to-current converter and a size of the second voltage-to-current converter is used to control the gain of the circuit.

20 Claims, 11 Drawing Sheets

AMPLITUDE CONTROL FOR CRYSTAL OSCILLATOR

CROSS REFERENCE TO RELATED APPLICATION

This application claims the benefit under 35 U.S.C. § 119(e) to U.S. Provisional Application No. 60/506,265 entitled "AMPLITUDE CONTROL FOR CRYSTAL OSCILLATOR" filed Sep. 25, 2003, the disclosure of which is hereby incorporated by reference in its entirety.

TECHNICAL FIELD

The present invention relates generally to electronic circuits, and in particular to crystal oscillator circuits.

BACKGROUND

The oscillations of a crystal are used in a variety of electronic circuits for producing clock signals or other frequency-based signals. Crystal oscillator circuits are commonly used to regulate the oscillations of a crystal. Regulating a crystal oscillator includes applying a controlled amount of voltage across the crystal, wherein a larger voltage applied to the crystal provides greater noise immunity but a shorter crystal life, and conversely, a smaller voltage applied to the crystal provides longer crystal life but a greater amount of noise.

In one conventional approach shown in FIG. 1, regulation of crystal oscillators is achieved by using transistors in a minimalist approach which relies upon the absolute value of transistor thresholds and transconductances (See "High-Performance Crystal Oscillator Circuits: Theory and Application", Vittoz, E. A.; Degrauwe, M. G. R.; Bitz, S.; Solid State Circuits, IEEE Journal, Volume: 23 Issue: 3, June 1998, Page(s): 774–783).

In another conventional approach shown in FIG. 2, regulation of crystal oscillators is achieved by the application of operational amplifiers for rectification, filtering, and regulation of the oscillator waveform.

In another conventional approach shown in FIG. 3, regulation of crystal oscillators is achieved by the use of external components to set loop bandwidth (See "Analog ALC Crystal Oscillators for High-Temperature Applications", Raul Andres Bianchi, Jean Michel Karam, and Bernard Courtois; Solid State Circuits, IEEE Journal, Volume: 35 Issue: 1, January 2000, Page(s): 2–14).

Disadvantages of the conventional solutions of FIGS. 2, 3 include the use of one or more operational amplifiers to produce the desired outcome.

As recognized by the present inventors, what is needed is a crystal oscillator control circuit that provides for regulation of the voltage applied to a crystal and reduces or eliminates the need for operational amplifiers.

It is against this background that embodiments of the present invention have been developed.

SUMMARY

According to one broad aspect of one embodiment of the present invention, disclosed herein is a circuit for controlling the amplitude of oscillation of a crystal. In one example, the circuit includes a peak detector detecting a peak signal from the crystal, the peak detector providing a voltage output; a first voltage-to-current converter coupled with the voltage output of the peak detector, the first voltage-to-current converter providing a peak output current; a first current-to-voltage converter coupled with the first voltage-to-current converter, the first current-to-voltage converter providing a first output voltage; a reference voltage signal; a second voltage-to-current converter coupled with the reference voltage signal, the second voltage-to-current converter providing a reference output current; a second current-to-voltage converter coupled with the second voltage-to-current converter, the second current-to-voltage converter providing a second output voltage; and an amplifier receiving the first and second output voltages, the amplifier having a control output that is proportional to the difference between the first and second output voltages, the control output for controlling the amplitude of oscillation of the crystal.

In one example, the reference voltage signal is derived from the crystal, such as to generate an average current of the crystal signal. In another example, the reference voltage signal is selected from two or more reference signals that may be provided by other conventional circuitry, such as via voltage dividers or other constant voltage reference sources. Logic may be provided for selecting the reference voltage from the two or more reference signals, such as a multiplexer for selecting the reference voltage from the two or more reference signals.

In one example, a ratio between a size of first voltage-to-current converter and a size of the second voltage-to-current converter is used to control a gain of the circuit. In another example, a ratio between a size of first current-to-voltage converter and a size of the second current-to-voltage converter is used to control a gain of the circuit. In another example, a ratio between a size of first voltage-to-current converter, a size of the second voltage-to-current converter, a size of first current-to-voltage converter, and a size of the second current-to-voltage converter is used to control a gain of the circuit.

In another embodiment, the circuit may also include a first current mirror coupled between the first voltage-to-current converter and the first current-to-voltage converter. A second current mirror may be coupled between the second voltage-to-current converter and the second current-to-voltage converter.

According to another broad aspect of another embodiment of the present invention, disclosed herein is a method of controlling the amplitude of oscillations of a crystal in an oscillator. In one example, the method includes detecting a peak signal from the crystal to produce a peak voltage output; converting the peak voltage output to a peak output current; converting the peak output current to a first output voltage; converting a reference voltage signal to a reference output current; converting the reference output current to a second output voltage; and applying the difference between the first and second output voltages to control the amplitude of oscillation of the crystal. The method may also include an operation of deriving the reference voltage signal from the crystal, or selecting the reference voltage from two or more reference signals.

In another example, the method may also include the operation of establishing a ratio between a size of first voltage-to-current converter and a size of the second voltage-to-current converter to control a gain of the circuit in order to provide an oscillator amplitude set point. In another example, the method may also include the operation of establishing a ratio between a size of first current-to-voltage converter and a size of the second current-to-voltage converter is used to control a gain of the circuit. In another example, the method may also include the operation of establishing a ratio between a size of first voltage-to-current converter, a size of the second voltage-to-current converter, a size of first current-to-voltage converter, and a size of the second current-to-voltage converter is used to control a gain of the circuit.

According to another broad aspect of another embodiment of the present invention, disclosed herein is a circuit for controlling the amplitude of oscillation of a crystal. In one example, the circuit may include a peak detector; a first voltage-to-current converter; a first current-to-voltage converter coupled with the first voltage-to-current converter; a second voltage-to-current converter; a second current-to-voltage converter coupled with the second voltage-to-current converter; and a differential amplifier; wherein a ratio between a size of first voltage-to-current converter and a size of the second voltage-to-current converter is used to control a gain of the circuit.

In one embodiment, wherein the reference voltage signal is derived from the crystal, or the reference voltage signal is a selected from two or more reference signals. The circuit may also include a first current mirror coupled between the first voltage-to-current converter and the first current-to-voltage converter.

The features, utilities and advantages of the various embodiments of the invention will be apparent from the following more particular description of embodiments of the invention as illustrated in the accompanying drawings.

DETAILED DESCRIPTION

Disclosed herein are circuits and methods for implementing amplitude control of crystal oscillators. Embodiments of the present invention may be used in various conventional oscillator designs which utilize some form of amplitude control to regulate the operation of a crystal oscillator. Various embodiments of the present invention are described herein.

Figure 1:
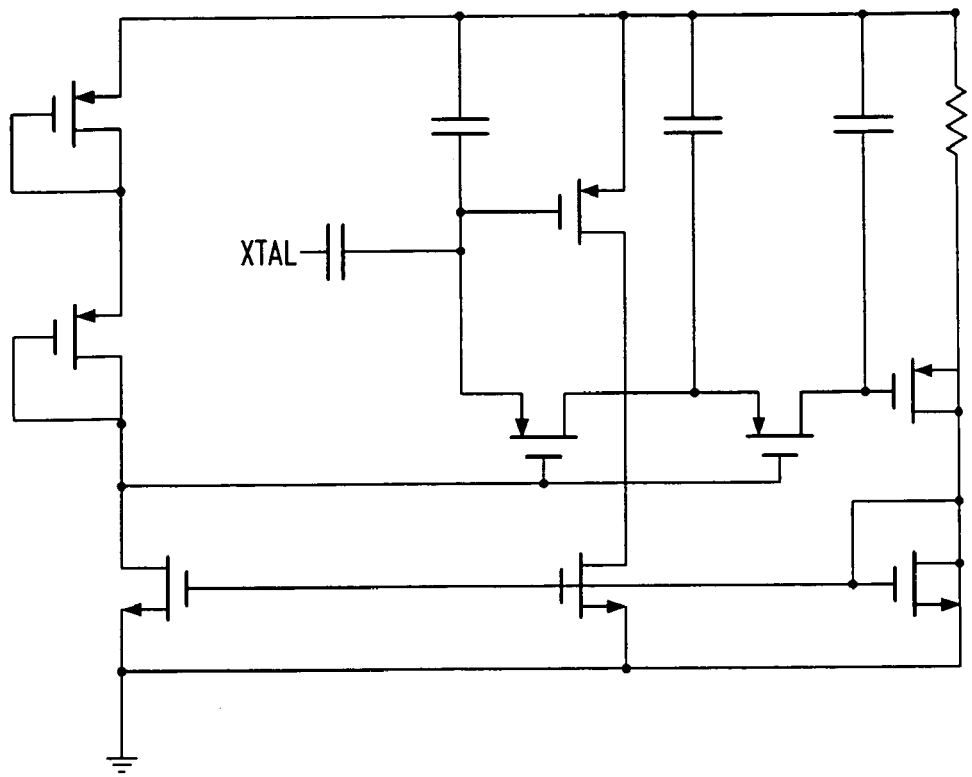
FIG. 1 illustrates an example of a circuit for regulating a crystal oscillator.
Figure 2:
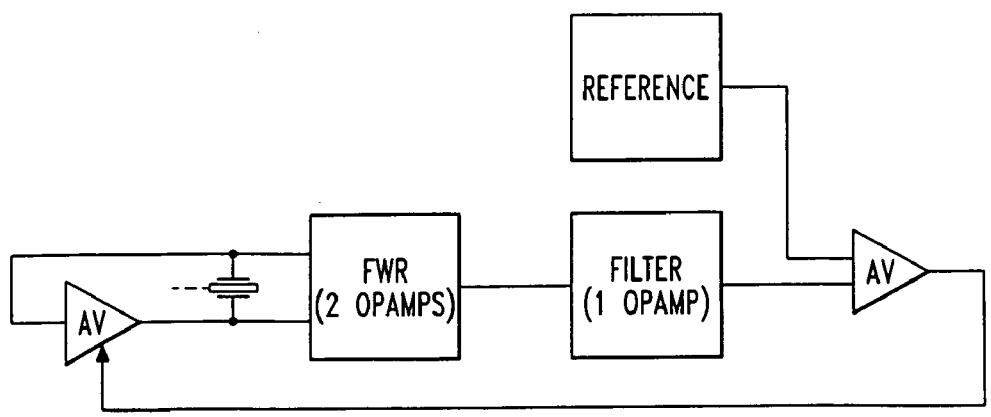
FIG. 2 illustrates an example of a circuit for regulating a crystal oscillator.
Figure 3:
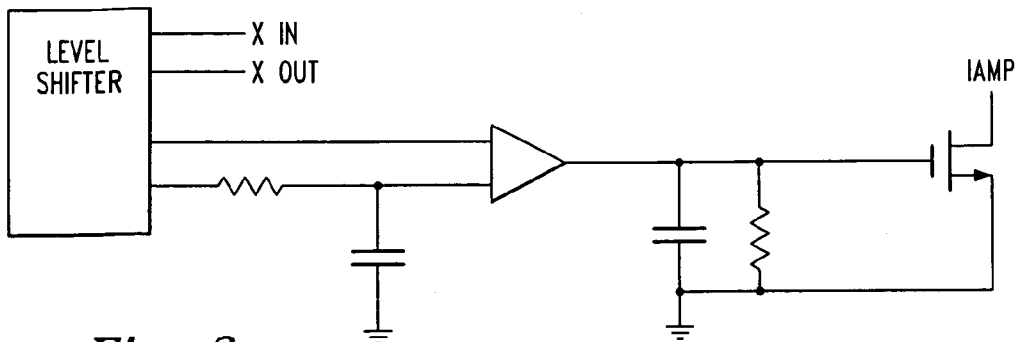
FIG. 3 illustrates an example of a circuit for regulating a crystal oscillator.
Figure 4:
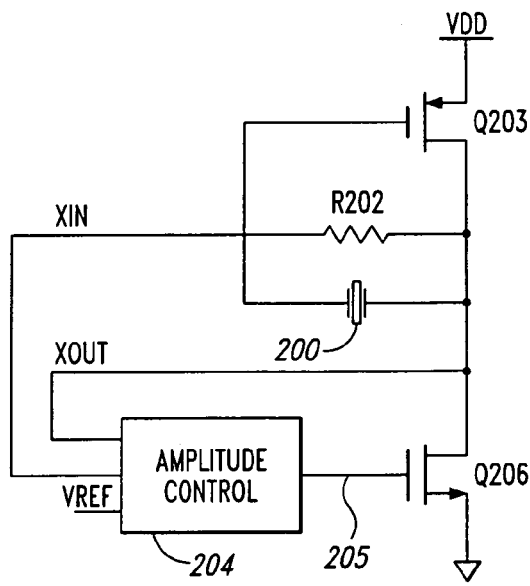
FIG. 4 illustrates an example of an oscillator circuit in which embodiments of the present invention may be utilized.

There are numerous examples of conventional oscillators in which embodiments of the present invention may be utilized. FIG. 4 illustrates one such example of a Pierce oscillator in which embodiments of the present invention may be utilized. It is understood that FIG. 4 is merely one potential application of embodiments of the present invention, and that embodiments of the present invention may be utilized in numerous other oscillator designs, architectures, or circuits. In FIG. 4, a crystal 200 and a resistor 202 are coupled between the gate and drain of P-channel transistor Q203 having its source coupled with a supply VDD. The term crystal as used herein includes but is not limited to quartz crystals, ceramic resonators, LC tank circuits, or similar frequency selective networks. The signals Xin, Xout may be taken across the crystal 200 and received by amplitude control 204. The output of amplitude control 204 is a control signal 205 which may drive the gate of N-channel transistor 206 having its drain coupled to the drain of transistor Q203 and to the gate of Q203 through R202, with crystal 200 also connected between the gate and drain of transistor Q203. Various embodiments of amplitude control 204 are illustrated herein, some of which may utilize an external reference signal shown as Vref in FIG. 4 and other embodiments which do not utilize an external reference signal.

In one example, as amplitude control output voltage 205 increases on the gate of transistor Q206, the drain current in transistor Q206 goes up. An increasing drain current in transistor Q206 will pull down on the gate of transistor Q203 (acting as an amplifier) and its drain current will increase to match the drain current of Q206. As the current in amplifier device Q206 increases, so too does its transconductance which can compensate for the resistive losses in the crystal network. That allows the amplitude control circuit 204 to manipulate and control the amplitude of the signal across the crystal (e.g., between Xin and Xout).

As used herein, the term "transistor" or "switch" includes any switching element which can include, for example, n-channel or p-channel CMOS transistors, MOSFETs, FETS, JFETS, BJTs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel MOS (metal oxide semiconductor) transistors, it is understood that other switching devices can be used, or that the invention may be implemented using the complementary transistor types.

Figure 5:
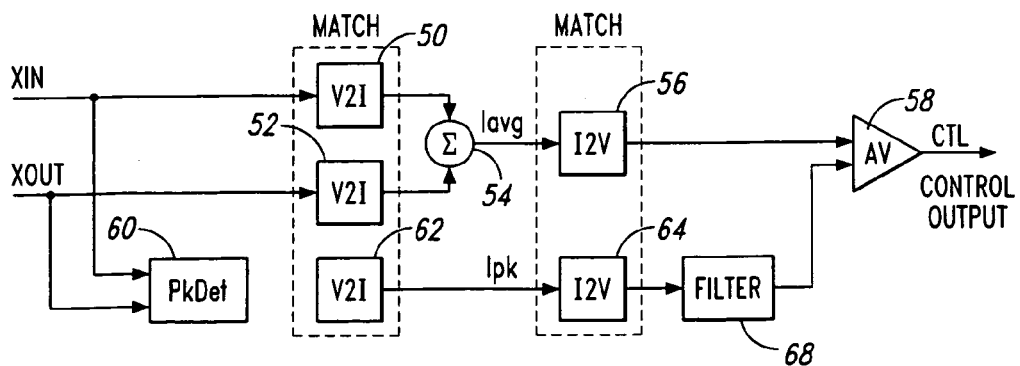
FIG. 5 illustrates a block diagram of a crystal regulator/amplitude control, in accordance with one embodiment of the present invention.

Referring to FIG. 5, FIG. 5 illustrates one embodiment of the present invention. In this example, a set of voltage to current converters 50, 52 are provided and voltage to current converters 50, 52 receive the input signals Xin and Xout. The current signals output from converters 50 and 52 are summed by block 54 to generate an average current which can be converted to a voltage by current to voltage converter 56. Peak detector 60 detects the peak of the crystal signals Xin, Xout and the peak voltage excursion is converted to a peak current by voltage current converter 62.

In one example, the currents produced by the voltage to current converters 50, 52, 62 (as well as those voltage to current converters in FIGS. 5, 7, 8, and 10) are mirrored before they are converted back into a voltage.

Figure 6:
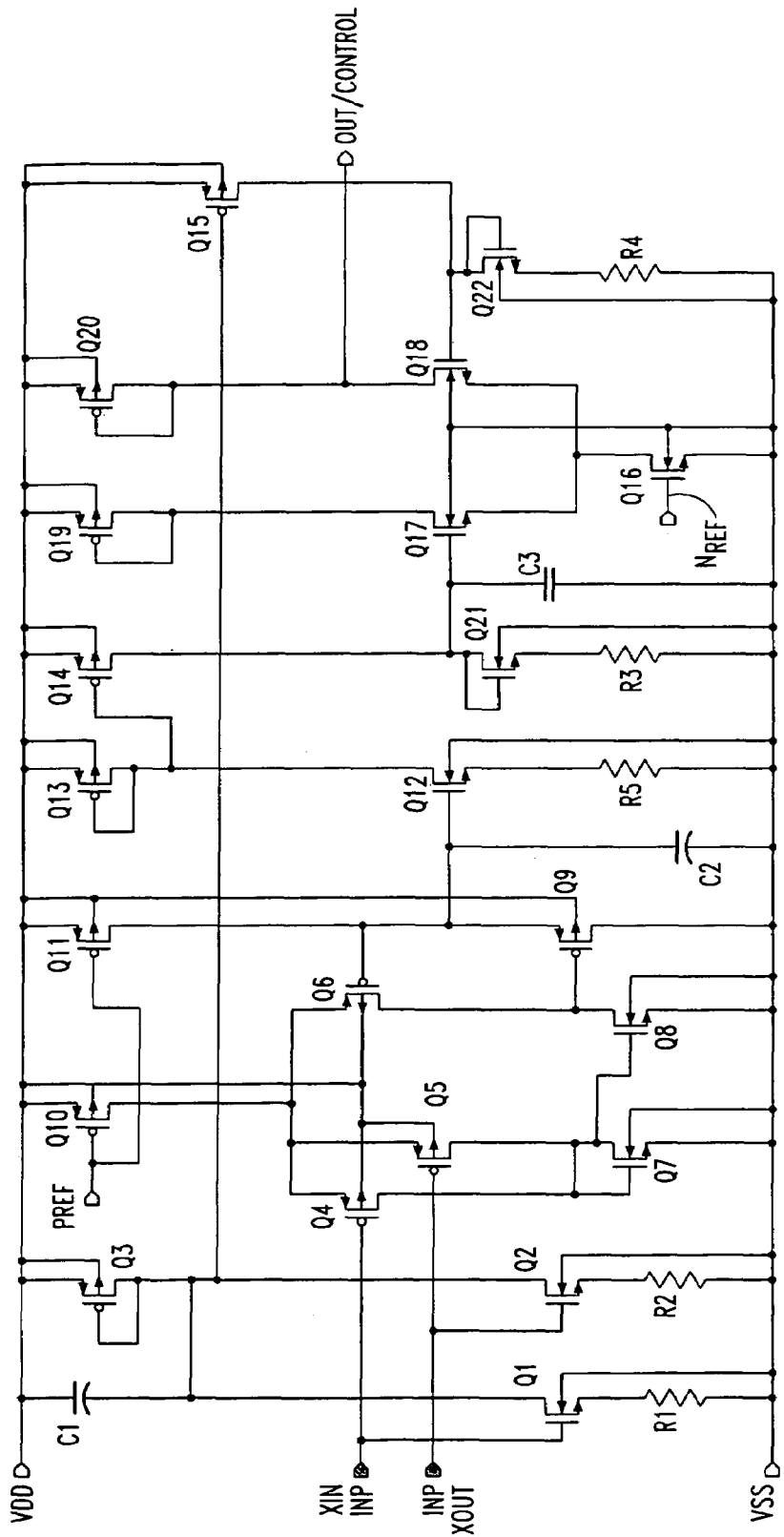
FIG. 6 illustrates an example of a circuit for regulating the amplitude of a crystal oscillator, in accordance with one embodiment of the present invention.

The peak current may be converted to a voltage by current to voltage converter 64, and the resulting voltage from converter 64 may be filtered by filter 68. A comparator or differential amplifier 58 may be provided to compare the signals from converter 56 and filter 68, in one example, to generate a control signal output based upon the differences between the signals at its inputs. The control signal output can be used or further processed to control a voltage applied across a crystal in an oscillator circuit. One example of an implementation of the embodiment of FIG. 5 is illustrated in FIG. 6.

In FIG. 5, by the application of ratios of devices, the amplitude of a crystal oscillation signal between nodes labeled Xin and Xout may be controlled. Xin and Xout are converted to currents and summed such that for a sine wave, the average current out will be DC. Simultaneously, Xin and Xout both are provided to a peak detector such that a greater excursion between the two (whether the sense is chosen to be positive or negative) is captured as the peak voltage and that is also converted to a current. In order to control the difference between Iaverage and Ipeak, a ratio between voltage to current converters 50 and 52 is set with respect to converter 62. Alternatively, in converting the currents back into voltages in blocks 56 and 64, these blocks could be implemented in a fixed ratio that controls the amplitude of the difference of Iaverage and Ipeak.

Filter 68 provides the dominant pole of the system and filters the peak voltage before it is applied to the comparator/amplifier/gain stage 58. The gain stage 58 compares the peak voltage with whatever ratio is applied relative to the average voltage. Based on the difference between Iaverage and Ipeak, the control output changes the gain of the oscillator to alter the amplitude of the signal between Xin and Xout.

In terms of matching, in one example, blocks 50, 52, 62 can be matched, and these blocks can be matched to blocks 56 and 64. In this example, the circuit would be regulating to zero amplitude and an offset in the comparator or the gain stage 58 can be provided to produce a non-zero set point for the desired amplitude to control to. Alternatively, the ratio of 50 and 52 to 62 could set the amplitude, or the ratio between current to voltage converters 56 and 64 could set the amplitude for the amplitude control circuit to regulate to.

For instance, elements 50, 52 and 62 could be implemented with different numbers of unit elements of transistors and resistors to fix the relationship between how much current is produced by the averaging of Xin and Xout relative to the amount of current that is produced by the peak voltage at Xin and Xout. By making that ratio highly deterministic, a deterministic relationship between Iaverage and Ipeak is provided, along with the difference between the average on Xin and Xout to the peak excursion on Xin and Xout. For example, if 1.1 times more current was produced by Iaverage than Ipeak, the peak voltage would need to be 10% larger to balance the Ipeak to Iaverage and therefore Xin and Xout relative to the peak excursion would be the average times 1.1.

FIG. 6 illustrates one example of an embodiment of the present invention. In FIG. 6, the control signal output is based upon the differences between the average and peak crystal signals Xin, Xout, shown in FIG. 6 as INP, INN (also referred to interchangeably herein as Xin, Xout). Transistor Q1 and resistor R1 provide a voltage to current converter of one end of the crystal signal, and transistor Q2 and resistor R2 provide another voltage to current converter of the other end of the crystal signal. Transistor Q3 sums the current outputs of Q1, Q2. A peak detector is provided by transistors Q4, Q5, Q6, Q7, Q8, and Q9 together with the bias current generator Q10, Q11. Transistor Q12 and the resistor R5 provide a voltage to current converter that receives the voltage output of the peak detector and generate a peak current. That current, as well as the average current from Q3, are both mirrored and the currents are then applied to the current to voltage converters. The average current is received by a current to voltage converter formed by transistor Q22 and R4, and the peak current is received by a current to voltage converter formed by transistor Q21 and R3. Capacitor C3 provides a filter, and is coupled across the drain of Q21 and ground. An amplifier (e.g., comparator gain stage or error amplifier) is provided by transistors Q17, Q18, Q19 and Q20, with Q16 the bias current generator for the amplifier.

Stated differently, in FIG. 6 transistors Q1, Q2 and Q3, with resistors R1 and R2 and capacitor C1, convert the two input phases of the crystal oscillator waveform into a direct current (DC) potential, which drives the current source Q15 with a current proportional to the average potential of the two input phases of the crystal oscillator waveform. If the crystal signals have an asymmetry in magnitude or DC offset, this portion of the circuit may be separated from Q4 and Q5, and may then alternatively accept a single DC voltage reference. Devices Q4 through Q11 form a peak detector circuit which, as depicted, captures the closest excursion to ground and stores the resulting potential on capacitor C2. Device Q11 may produce a very small "trickle" current which allows the potential on C2 to droop so that diminishing signal amplitudes may be tracked. A reference voltage "pref" is input which sets the peak detector bias current. The peak detector circuit may be realized as a positive peak detector by realizing the same topology with N and P devices exchanged and are referenced to opposite supplies. For greater headroom, the follower Q9 can be replaced with an N channel field effect transistor (FET), and changing Q8 to a diode connection, and tying the gate of the N channel version of Q9 to the drain of Q7. Level shifting may also be incorporated into the peak detector circuit to improve low voltage operation. Transistors Q12, Q13, and Q14 and resistor R5 convert the peak detector output into a current proportional to the peak crystal oscillator signal level. The drain currents of Q14 and Q15 are applied to resistors R3 and R4 and MOS diodes Q21/Q22, with the voltage at the gate of Q17 also filtered using capacitor C3 to set the dominant pole of the amplitude regulation loop. Transistors Q16 through Q20 form a differential amplifier, with the output from the circuit taken across the P channel diode connected FET Q20. This potential sets the current into the crystal amplifier. An input potential "nref" sets the output stage current level.

The voltages at the gates of Q17 and Q18 steer the output current as a function of the error voltage between the peak and average (or reference) potentials of the crystal oscillator waveforms as the circuit is realized in FIG. 4. Transistor Q12 and resistor R5 may incorporate scale factors with reference to transistors Q1 and Q2 and resistors R1 and R2 to produce ratio flexibility for determining the regulated magnitude of the crystal oscillator voltage output.

A scale factor between the output steering devices Q17 and Q18, finally, may also be incorporated so that, when the crystal oscillation magnitude is correct, the voltages at the gates of Q17 and Q18 are equal, if necessary. The drain currents of Q17 and Q18 are steered by the differential voltage between the gates of the two devices, providing a smooth, continuous control output to the amplifier.

In FIG. 6, N-channel transistor Q1 has at its gate crystal signal INP. The source of transistor Q1 is coupled to a reference VSS such as ground through resistor R1. N-channel transistor Q2 receives at its gate crystal signal INN and has its source coupled with ground through resistor R2. The drains of transistors Q1, Q2 are coupled to capacitor C1 which is coupled to supply VCC and with the gate and drain of P-channel transistor Q3 which has its source coupled to the supply VDD.

P-channel transistor Q4 receives at its gates the crystal signal INP and has its source coupled with the drain of P-channel transistor Q10, the source of P-channel transistor Q5, and the source of P-channel transistor Q6. The drain of transistor Q4 is also coupled with the gate and drain of N-channel transistor Q7 and the drain of P-channel transistor Q5 and the gate of transistor Q8. Transistor Q5 receives at its gate the crystal signal INN.

P-channel transistor Q6 has its gate coupled with the drain of P-channel transistor Q11 and the source of P-channel transistor Q9, while the drain of transistor Q6 is coupled with the gate of transistor Q9 and the drain of N-channel transistor Q8. N-channel transistor Q7 has its source coupled with ground, and its gate coupled with its drain which are coupled with the gate of N-channel transistor Q8 and the drain of P-channel transistor Q5. N-channel transistor Q8 has its source coupled with ground, and its drain coupled with the gate of P-channel transistor Q9, and transistor Q9 has its drain coupled with ground. The source of both P-channel transistors Q10, Q11 are both coupled with the supply VDD, and the gates of transistors Q10, Q11 are both coupled with a bias signal PREF. The drain of transistor Q10 is coupled with the sources of transistors Q4, Q5, and Q6, while the drain of transistor Q11 is coupled with the source of transistor Q9, the gate of transistor Q12, and one end of capacitor C2.

N-channel transistor Q12 has its gate coupled with the gate of transistor Q6, the drain of transistor Q11, the source of transistor Q9, and to capacitor C2 which is coupled with ground. The source of transistor Q12 is coupled to ground through resistors R5, while the drain of transistor Q12 is coupled with the gate and drain of P-channel transistor Q13 and the gate of P-channel transistor Q14. The source of transistor Q13 and of transistor Q14 are both coupled with the supply VDD, and transistor Q13 has its gate and drain coupled together and coupled with the gate of transistor Q14. The drain of transistor Q14 is coupled with the gate of transistor Q17 and the drain and gate of transistor Q21.

N-channel transistor Q21 has its gate coupled with its drain, which are both coupled to the gate of N-channel transistor Q17. The source of transistor Q21 is coupled with ground through resistor R3.

P-channel transistors Q19 and Q20 are coupled in parallel with their sources coupled with the supply VDD and their gates and drains coupled to each other, respectively. The gate and drain of transistor Q19 is coupled with the drain of N-channel transistor Q17, while the gate and drain of transistor Q20 is coupled with the drain of N-channel transistor Q18. The source of transistor Q17 is coupled with the source of transistor Q18 and both are coupled with the drain of N-channel transistor Q16 which receives the bias signal NREF at the gate of transistor Q16 with its source coupled with ground.

P-channel transistor Q15 has its source coupled with the supply VDD, and its gate coupled with the gate and drain of transistor Q3 and the drain of transistor Q2. The drain of transistor Q15 is coupled with the gate of transistor Q18 and the drain and gate of N-channel transistor Q22, and is also coupled with ground through capacitor C3. Transistor Q22 has its gate and drain coupled together, and its source coupled with ground through resistor R4.

The output control signal of the example of FIG. 6 may be taken from the gate and drain of transistor Q20 which is coupled with the drain of transistor Q18, in one example.

In operation, transistors Q1 and Q2 together with resistors R1 and R2 produce an average a DC average current in Q3 which is mirrored to the P-channel device Q15 of FIG. 6. That is the voltage to current converter that produces a current Q15 proportional to the average voltage of the crystal. Devices Q4 through Q12 convert the peak negative excursion between INP and INN into a current which is mirrored from Q12, Q13, Q14, hence the current in Q14 is proportional to the peak crystal voltage excursion.

In this example, the peak detector captures the closest excursion to ground between INP and INN. If INP and INN are perfectly symmetrical, then the same peak is detected on each half cycle. In one example, the peak detector acts as a rectifier and peak detector. Between INP and INN, the voltage that is closer to ground between the two determines how much current is flowing in the peak detector, and so the differential pair formed between Q4, Q5 and Q6 is performing a rectified peak detection for the negative extreme. If there is asymmetry, then the lesser of INP and INN is the peak value that will be detected, or a scale factor between transistors Q4, Q5 may be used to compensate for an imbalance. The peak voltage is then filtered by capacitor C2 to produce a DC potential that appears on the gate of Q12.

The DC potential that is equal to the peak excursion of the crystal is converted into a current by device Q12 with R5. Therefore the ratio of the device width and length of Q12 plus R5, if it is equal to that of Q1 and R1, Q2 and R2, the amount of current per unit voltage will be identical. Whether a ratio of unity or another value is chosen, there will be a deterministic regulation point if ratios of like devices are used. Q12 converts the peak crystal voltage into a current, and that current is mirrored at Q14. At this point, Q15 has a drain current that is proportional to the average voltage of the crystal, and the drain current in transistor Q14 is proportional to the peak voltage of the crystal. Those two currents are converted to voltages using Q21 and R3 and Q22 and R4. These devices can be a fixed ratio with regard to Q1, R1, Q2, R2, Q12 and R5. Capacitor C3 in the output stage sets the 3 dB bandwidth of the regulator circuit; the dominant pole of the circuit may be produced by capacitor C3 in parallel with Q22 and R4. In one example, there is no similar capacitance on the opposite side of the comparison circuit because the average voltage is rendered DC by the averaging of Q1 and Q2 drain currents with the small filter cap C1. The voltages then at the gates of Q17 and Q18 represent the voltage comparison of the average voltage across the crystal to the peak voltage across the crystal and the comparison of those two drain voltages changes the ratio of the drain currents of Q17 and Q18 which are connected to diode connected devices Q19 and Q20, respectively. The device Q20 voltage output (OUT) is the potential which sets the current in the amplifier that is actually driving the crystal, so the higher the current in Q20, the larger the gain of the amplifier connected to the crystal.

In one example, the control output signal OUT can be used to set a bias current in an amplifier in a crystal oscillator. The bias current in the amplifier is proportional to the transconductance of the amplifier, and the transconductance of the amplifier is the quantity that balances against the losses in the crystal and other circuit elements/parasitics.

Setting the DC current in the amplifier can control the gain of the oscillator, which can control the magnitude of the voltage across the crystal.

Figure 7:
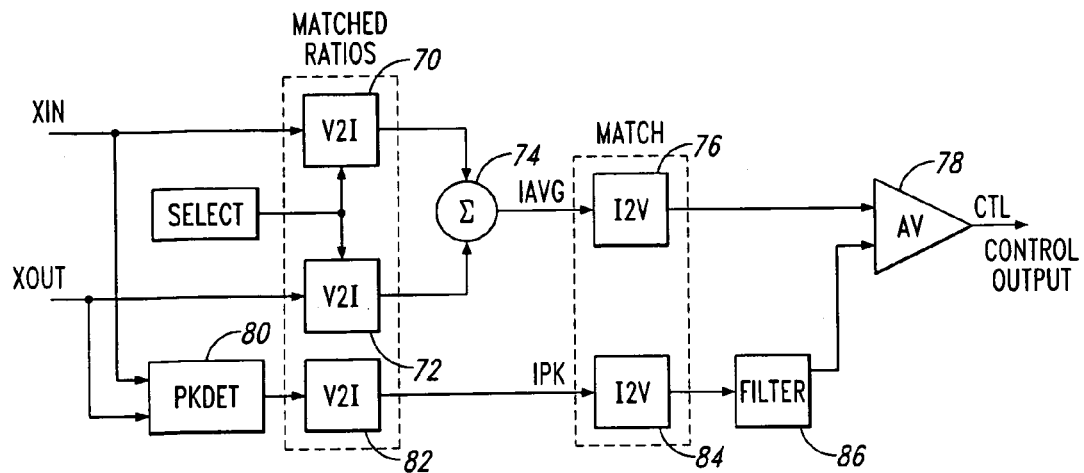
FIG. 7 illustrates another block diagram of a crystal regulator/amplitude control, in accordance with one embodiment of the present invention.

FIG. 7 illustrates another example of an embodiment of the present invention. In this example, an amplitude adjustment feature is provided in that a selection may be made as to the scale or amplitude of voltage to current converters 70, 72 so as to provide some selectable variability in the average current value provided by summing block 74. This average current is converted by a current to voltage converter 76 whose output may be coupled with comparator/differential amplifier 78 to generate a control signal. In a manner similar to FIG. 5, the crystal signals Xin and Xout have their peak excursions or values detected by peak detector 80 and the resulting peak signal is converted to a current by voltage to current converter 82 which generates a peak current that may be converted by current to voltage converter 84 and filtered by filter 86 and fed into comparator/differential amplifier 78 to generate a control signal output based upon the differences between the signals at its inputs. The control signal output can be used or further processed to control a voltage applied across a crystal in an oscillator circuit.

In FIG. 7, the devices 70, 72 are scaled relative to block 82 and that scale factor is selectable based on a configuration word input of arbitrary bit widths—for example, one of 2, 4, 8, 16 possible amplitudes that are selectable. In one example, with identical unit elements of MOSFETS and resistors between block 70, 72 and 82 (which comprise voltage to current converters), one can select different numbers of those unit elements in FIG. 7. The ratios of 70 and 72 relative to 82 are chosen to be the selectable quantity. Alternatively, the same function can be realized by altering the scale factor of block 82 relative to a fixed 70 and 72. Or by digitally selecting the number of unit elements, the ratio between blocks 76 and 84 can be manipulated, in this instance in concert with the inverse ratios of the gains of the current mirrors formed by combinations of blocks 74, 76 and blocks 82, 84.

Figure 8:
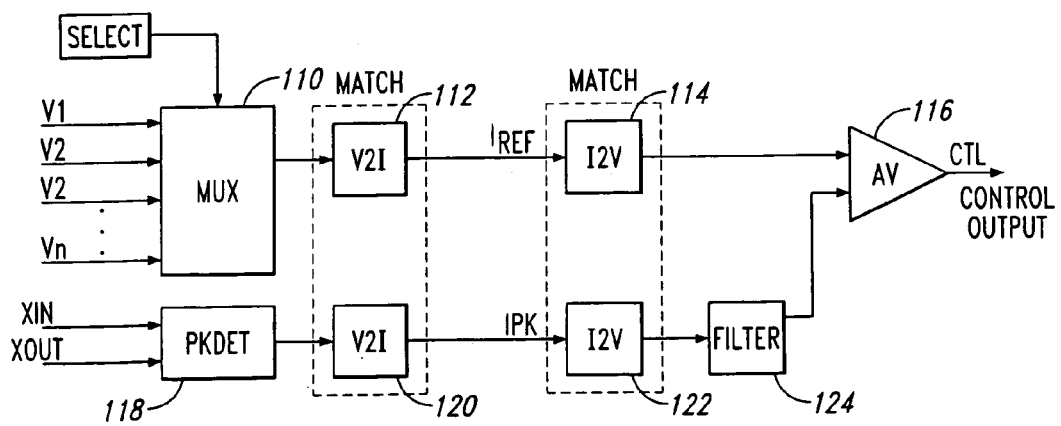
FIG. 8 illustrates another block diagram of a crystal regulator/amplitude control, in accordance with one embodiment of the present invention.

FIG. 8 illustrates another example of an embodiment of the present invention. In FIG. 8, a peak voltage from the oscillator is compared with a selectable reference voltage that is selected from a plurality of various reference voltages. In the example of FIG. 8, a multiplexor 110 is provided with a plurality of reference voltages V1, V2, V3, VN from which one of these reference voltages is selected through multiplexor 110 and converted into a current by voltage to current converter 112 to produce a reference current. The reference current is converted into a voltage by current to voltage converter 114 whose output is coupled with an input to comparator/differential amplifier 116. The crystal signals Xin, Xout are received by a peak detector 118 whose output is converted into a peak current signal by voltage to current converter 120. The peak current signal is converted to a voltage through current to voltage converter 122 whose output is filtered by filter 124 and coupled with an input to comparator/differential amplifier 116. Comparator/differential amplifier 116 generates a control signal output based upon the differences between the signals at its input. The control signal output can be used or further processed to control a voltage applied across a crystal in an oscillator circuit. One example of an implementation of the embodiment of FIG. 8 is illustrated in FIG. 9.

In FIG. 8, the relationships between ratios of the voltage to current converters is simplified because, in one example, the gains of the voltage to current converters are set to one. For example, identical devices (i.e., centroid matched arrays of unit elements) can be used in blocks 112, 120, so as to form a match between block 112 and 120. The peak excursion between Xin and Xout can be set based one of any one of a number of reference input voltages via multiplexor 110.

In FIG. 8, a programmable gain is provided to the error amplifier block 116. This is achieved by altering, through digital word control, the bias current to that amplifier 116. Also, a power down function is realized with inverter block I8 (FIG. 9) and this function turns the circuit off completely. The gates I7 and NOR5 control the maximum attack current during start-up of the amplifier. In this implementation, the offset current generators Q64, Q65, Q63, Q66 (FIG. 9) are spares that could be optioned in with metal connections if need be to manipulate the start-up characteristics of the circuit. The gates I1, I2, NOR1 through NOR4, I3 through I6 (FIG. 9), control the input MUX that selects the voltage reference to which the circuit will regulate the crystal amplitude.

Figure 9A:
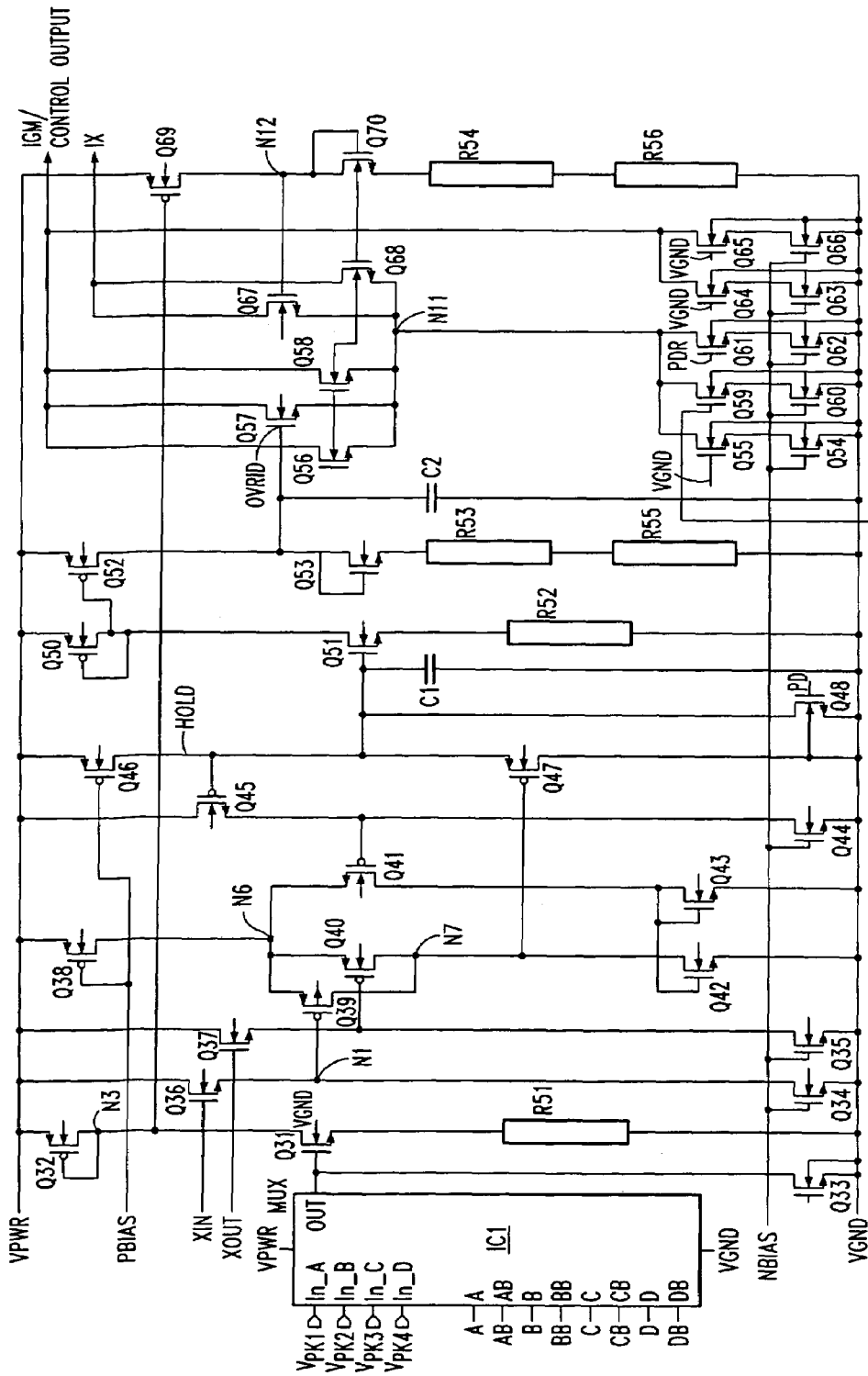
FIG. 9 illustrates an example of a circuit for regulating the amplitude of a crystal oscillator, in accordance with one embodiment of the present invention.
Figure 9B:
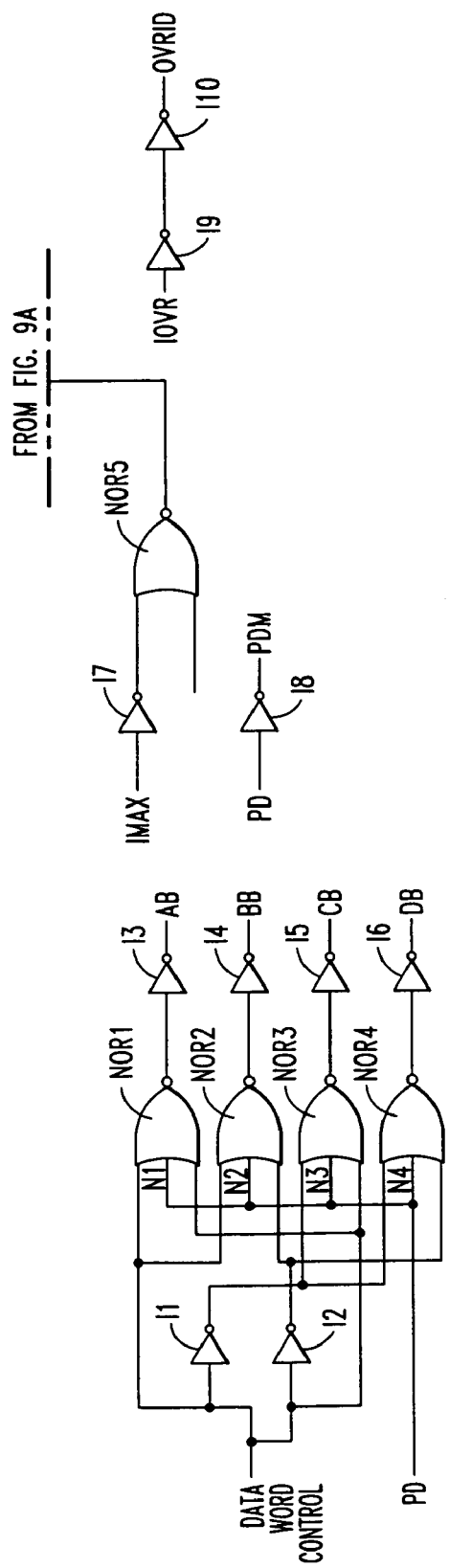

FIG. 9 illustrates another example of an embodiment of the present invention. In the example of FIG. 9, a selectable voltage reference level is used to provide an adjustable amplitude across the crystal. A multiplexer IC1 has a plurality of reference voltages coupled with its inputs and the select lines are coupled with the logic portion of the circuit shown in FIG. 9. Based on the state of the logic signals, a particular reference voltage is selected by the multiplexer and applied to the gate of N-channel transistor Q31 and to the drain of N-channel transistor Q33. The operation of the control logic signals which control the select lines of the multiplexer IC1 is described below. The signals from the crystal Xin, Xout respectively drive the gate of N-channel transistor Q36 and N-channel transistor Q37.

In FIG. 9, a multiplexer IC1 is provided for controllably selecting one of a plurality of reference voltages present at its inputs. The output of the multiplexer is received by a voltage to current converter formed by transistor Q31 and resistor R51, and a current mirror of transistors Q32 and Q69 generates a reference current. The reference current is converted to a voltage by a current to voltage converter of transistor Q70 together with R54 and R56.

Transistors Q39, Q40, Q41, Q42, Q43 with the bias current generator Q38 and level shifting transistors Q37 and Q36 provide a peak detector receiving the crystal signals. The output device Q47 with a bias current generator Q46 captures the peak excursion on the node labeled HOLD and that potential is stored on capacitor C1. The output of the peak detector is received by a voltage to current converter including transistor Q51 with resistor R52 and a current mirror including transistors Q50 and 52. This current is received by a current to voltage converter of transistor Q53 and resistors R53 and R55.

In FIG. 9, R53 and R55 are the same resistance that is applied in R51 and R52 and R54 and R56. In this example, implementation, the voltage to current converters have a gain of one-half in their current mirrors so that the filter (capacitor C2) is applied across a larger impedance making a lower frequency dominant pole for the circuit. This is an instance where a ratio is used in realizing the mirror portions of the voltage to current converters to maintain a given pole frequency while reducing the size/area of capacitor C2.

A comparator/differential amplifier includes transistors Q57, Q58, Q56, Q67, Q68. Bias current generators are provided by transistors Q55 and Q54, Q59 and Q60, Q61 and Q62. There is an offset current provided to the output of the system in the amplifier which includes Q64, Q63, Q65 and Q66. These devices are controlled from the logic circuits that are shown at the bottom of FIG. 9.

Transistor Q31 has its source coupled to ground through resistor R51 and its drain coupled with the gate and drain of P-channel transistor Q32 which has its source coupled with the power. The gate of transistor Q31 is coupled with the drain of P-channel transistor Q33 which has its gate coupled with the signal power-down ("PD") and has its source coupled with ground.

N-channel transistor Q34 has its gate coupled with the N bias signal and its source coupled with ground, and its drain coupled with the gate of P-channel transistor Q39 and the source of transistor Q36. N-channel transistor Q35 has its gate coupled with the N bias signal, its source coupled with ground, and its drain coupled with the gate of P-channel transistor Q40 and the source of N-channel transistor Q37. Both transistors Q36, Q37 have their drains coupled with the supply Vpower.

P-channel transistor Q38 has its source coupled with Vpower, its gate coupled with a bias signal, shown as Pbias, and its drain coupled with node N5 which is coupled with the sources of transistors Q39, Q40, and Q41. Bias signals such as Pbias and Nbias can be provided by an conventional reference signal generator, for example a supply-independent bias circuit. The gate of transistor Q39 is coupled with the source of transistor Q36 and the drain of transistor Q34 at node N1. The drain of transistor Q39 is coupled with the drain of transistor Q40, the gate of transistor of Q47, and the drain of transistor Q42. The drain of transistor Q41 is coupled with the gate and drain of transistor Q43 and the gate of transistor Q42.

N-channel transistors Q42 and Q43 each have their sources coupled with ground. N-channel transistor Q44 has its gate coupled with the N bias signal, its source coupled with ground, and its drain coupled with the gate of transistor Q41 and the source of transistor Q45. N-channel transistor Q45 has its drain coupled with the supply Vpower and its gate coupled with the drain of transistor Q46 and the drain of transistor Q47 as well as to ground through capacitor C1 and is also coupled with the gate of transistor Q51.

P-channel transistor Q46 has its gate coupled with the P bias signal, its source coupled with the supply Vpower and its drain coupled with the gates of transistors Q45 and Q51. As shown in FIG. 9, the gate of transistor Q45 is labeled as the "HOLD" node, and various devices are coupled therewith, in one example. N-channel transistor Q47 has its drain coupled with the HOLD node, and its source coupled with ground. N-channel transistor Q48 has its source coupled with ground, its gate coupled with the power-down signal (PD), and its drain coupled with the HOLD node.

P-channel transistor Q50 has its source coupled with the supply Vpower, and its gate and drain coupled together with the drain of transistor Q51 and the gate of transistor Q52. N-channel transistor Q51 has its gate coupled with the hold node, and its source coupled to ground through resistor R52.

P-channel transistor Q52 has its source coupled with the supply Vpower, its gate coupled with the drain of transistor Q50, and the drain of transistor Q52 is coupled with the drain and gate of transistor Q53 and the gate of transistor Q57, which is also coupled to ground through capacitor C2. N-channel transistor Q53 has its gate and drain coupled together, and to the drain of Q52, and its source coupled to ground through resistors R53, R55 in one example.

N-channel transistors Q54, Q60, Q62, Q63, Q66 each have their gates coupled with the N bias signal, their sources coupled with ground, and their drains coupled with the sources of N-channel transistors Q55, Q59, Q61, Q64, and Q65, respectively. The gates of transistors Q55, Q64, and Q65 are coupled with ground. The drains of transistors Q55, Q59, and Q61 are coupled with node N11, while the drains of transistors Q64, Q65 are coupled together with the IGM output signal which can be used to control amplifier gain. The gate of transistor Q59 is coupled with the output of NOR gate NOR5 while the gate of transistor Q61 is coupled with the output of inverter I8.

N-channel transistor Q56 has its gate coupled with the signal OVRID, which is on an amplitude control override, its drain coupled with the IGM signal, and its source coupled with the node N11 such that when the OVRID signal is asserted high, the amplitude control circuit is bypassed and the amplifier is set to its maximum gain. N-channel transistor Q57 has its gate coupled with capacitor C2 and the drain of transistor Q52, and the drain of transistor Q57 is coupled with the IGM signal, while the source of transistor Q57 is coupled with the node N11. N-channel transistor Q58 has its source coupled with node N11, its drain coupled with the IGM output signal, and its gate coupled with ground. N-channel transistor Q67 has its source coupled with node N11, its drain coupled with the IX signal and its gate coupled with the drain of transistors Q69, Q70 at a node labeled N12. The signals IX and IGM may be compared to facilitate an external output blanking function. N-channel transistor Q68 has its drain coupled with the IX signal, its source coupled with node N11, and its gate coupled with ground. P-channel transistor Q69 has its source coupled with the supply Vpower, its gate coupled with the drain of transistor Q31, and its drain coupled with the drain of transistor Q70 at node N12. N-channel transistor Q70 has its drain and gate coupled together, and its source coupled to ground through resistors R54, R56.

Various logic devices can be used in FIG. 9 for different functions. For instance, inverter I1, I2, and NOR gates NOR1, NOR2, NOR3, and NOR4, and inverters I3, I4, I5, I6 can be used to provide selection logic for the multiplexer IC1. A logic input signal, which may be implemented as a register value, data word or data byte or other data signal, can be processed along with a power-down signal PD such that when the power-down signal is inactive, the value of the input data determines which voltage reference is selected by the multiplexer IC1. While FIG. 9 illustrates a set of discrete logic devices for determining the selection of one of four values as the select line input of multiplexer IC1, it is understood that other logic configurations could be used to perform the same or similar function.

A signal Imax can be used to set the maximum gain for the amplifier in order to provide flexibility to drive crystals which may be more or less lossy. Imax is inverted through inverter I7 and input into NOR gate NOR5 along with the power-down signal PD. The output of NOR gate NOR5 drives the base of transistor Q59. Various signals and their complements may be made available, such as the power-down signal through inverter I8, and the override signal OVERID may be buffered through a pair of inverters such as I9, I10 as shown in FIG. 9 if desired.

In operation of the example of FIG. 9, one of four input reference voltages is selected through a configuration word so that one of four different levels will be the set point for the amplitude control system. This is applied to transistors Q31 and Q32, a voltage to current converter, together with the mirror formed by Q32 and Q69. The current in the drain of Q69 is converted back into a voltage across transistor Q70 with resistor R54 and R56. The gain of that path is one-half in the current leg and is applied across transistors and resistors that are scaled to reproduce a gain of one through that path to the error amplifier. The alternate path is the peak detected voltage, detected between Xin and Xout. In this implementation, the closest excursion to ground is captured and held on the node labeled HOLD across component C1 at the output of the peak detector. This voltage is then transformed into a current using Q51, R52, together with the current mirror with a gain of one-half (as in the other path) between transistors Q50 and Q52 and then applied across twice the impedance that was used to derive the original current with Q53, R53 and R55. This voltage is filtered by capacitor C2 forming the dominant pole. This voltage difference is then applied to the error amplifier comprised of transistors Q56, Q57, Q58, Q67 and Q68. The difference voltage at the input to that system changes the relationship between an offset current that is not used and the current to the amplifier. Hence, there is a relationship between the gain of the amplifier and the difference between the peak detected voltage between Xin and Xout and the reference voltage level.

Figure 10:
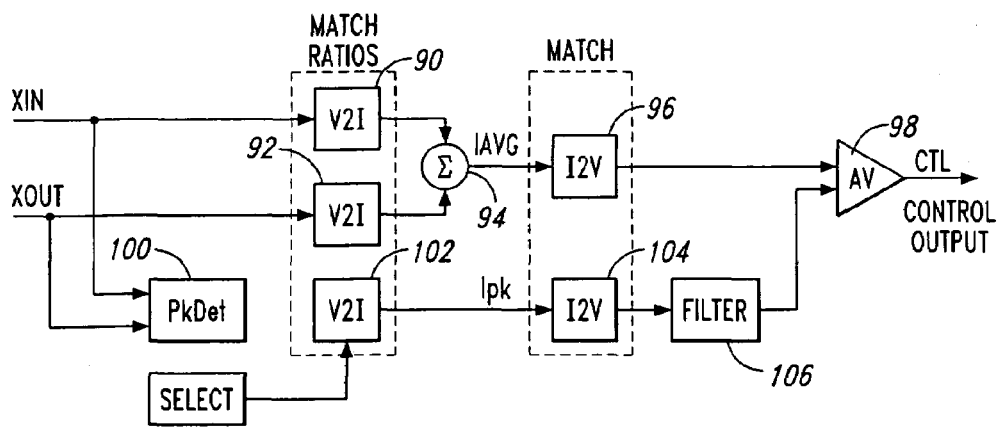
FIG. 10 illustrates another block diagram of a crystal regulator/amplitude control, in accordance with one embodiment of the present invention.

FIG. 10 illustrates another example of an embodiment of the present invention. In FIG. 10, variable transconductance in the peak value signal path is provided to allow adjustable signal amplitude. In FIG. 10, block 102 has a variable voltage to current characteristic that is set, in one example, by unit elements which comprise the voltage to current converter 102 relative to blocks 90 and 92. In this case, the voltage to current converter 102 has several ratios that are selectable by the choice of a binary word. As in the case of FIG. 7, the voltage to current conversion next goes through a current mirror to be applied to the current to voltage conversion circuits 96 and 104, and that ratio of the current mirror could also be the quantity which is specifically controlled by the digital word altering the gain of the voltage current converter 102 such that the peak amplitude's relationship to the average value across the crystal is controllable to make the crystal oscillation waveform larger or smaller.

The crystal signals Xin, Xout are converted into an average current through voltage to current converters 90, 92 and summed by block 94. The average current is converted into a voltage by current to voltage converter 96 whose output is coupled with the input of comparator/differential amplifier 98. The crystal signals Xin, Xout are received by a peak detector 100 whose output is connected with voltage to current converter 102 which generates a peak current output signal. In one embodiment, voltage to current converter 102 has selectable transconductance so as to allow an adjustable signal amplitude in the peak current provided by 102. The peak current signal is converted into a voltage by current to voltage converter 104 whose output is filtered by filter 106 and coupled with comparator/differential amplifier 98. Comparator 98 generates a control signal output which is proportional to the difference between its received inputs. The control signal output can be used or further processed to control a voltage applied across a crystal in an oscillator circuit. One example of an implementation of the embodiment of FIG. 10 is illustrated in FIG. 11.

Figure 11A:
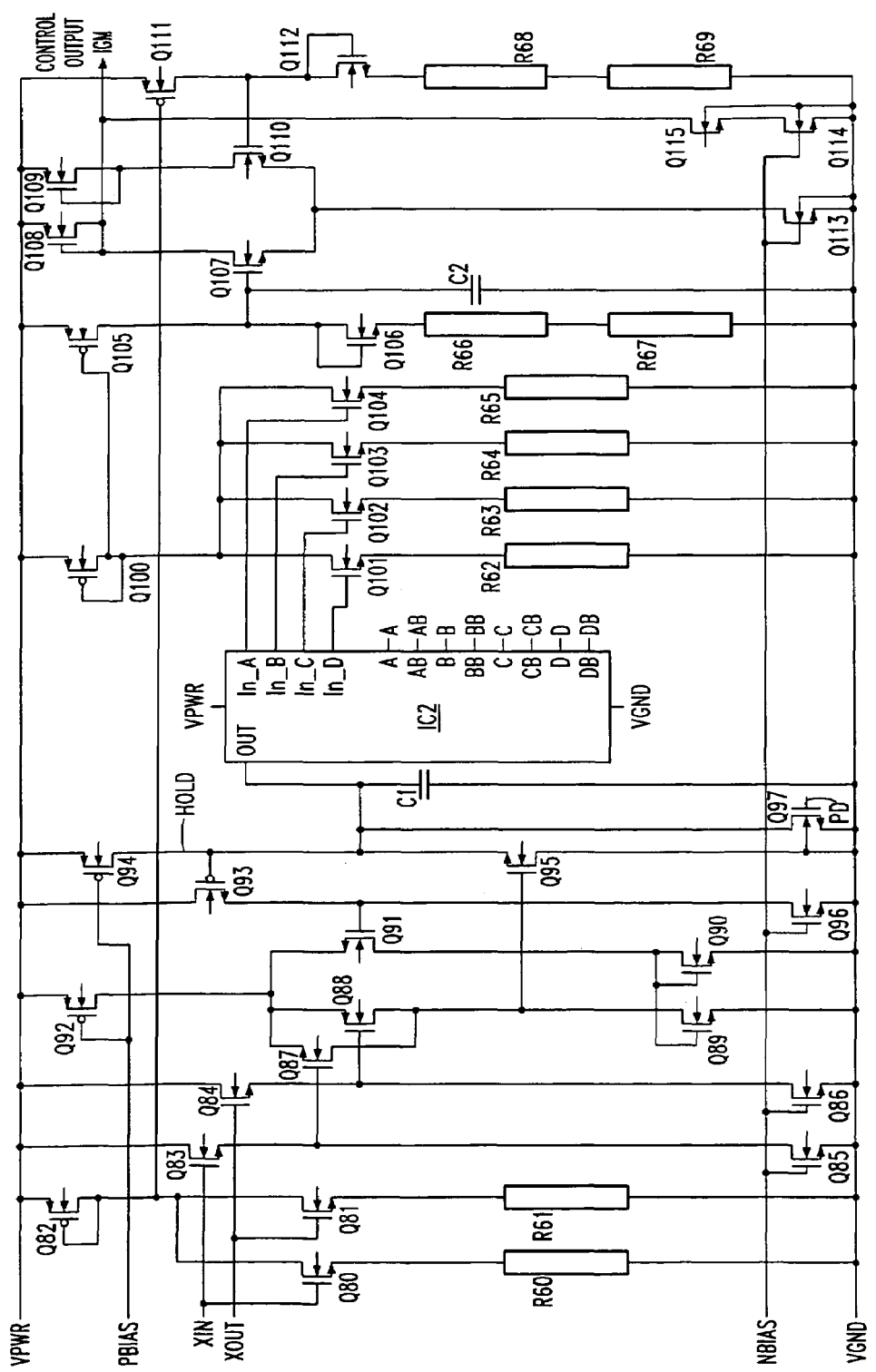
FIG. 11 illustrates an example of a circuit for regulating the amplitude of a crystal oscillator, in accordance with one embodiment of the present invention.
Figure 11B:
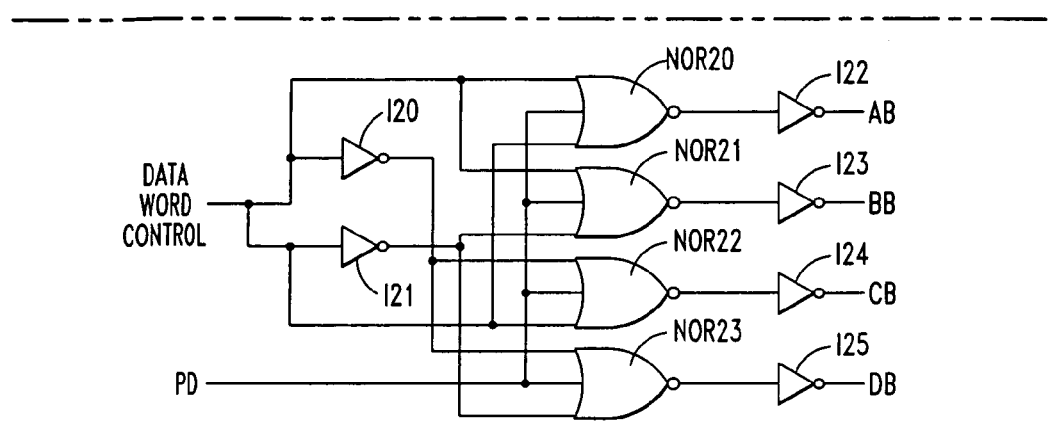

FIG. 11 illustrates another example of an embodiment of the present invention. In FIG. 11, this circuit provides an output signal which is based on a comparison between a peak and average value of the crystal signal, wherein a variable transconductance in the peak signal path can be selected to provide for adjustable amplitude of the output control signal. In FIG. 11, a multiplexer IC2 is provided with a plurality of transistors coupled with the selectable input of the multiplexer IC2. The control or select lines of the multiplexer can be controlled by various conventional logic circuits or devices, and as shown in FIG. 11, a plurality of inverters I20, I21, I22–I25 and NOR gates NOR20–NOR23 are configured in this example to provide the control or select lines to multiplexer IC2 based upon the value of the input data (which may be a portion of a register value, a set of bits, bytes, or words or portions thereof) and a power-down signal "PD" in one example. The logic shown in FIG. 11 provides the selection or one of four inputs to the multiplexer based on the input data provided to the logic. It is understood that the logic of FIG. 11 is provided by way of example only and that other logic circuits or discrete logic devices may be utilized in place of or in addition to the logic shown in FIG. 11 depending upon the particular implementation.

In FIG. 11, a peak detector includes devices Q83, Q84 and Q87, Q88, Q91, Q90, Q89, bias current generators Q85, Q86 and Q92, Q96, level shifting device Q93 and the output device Q95. These components together, with the hold capacitor C1, provide a DC level at the HOLD node which is equal to the peak excursion, the closest excursion to ground in this case between the crystal signals Xin and Xout. The reason for the negative peak detect is that the Pierce amplifier being controlled by this specific circuit is a PMOS amplifier with an NMOS bias current generator (FIG. 4) therefore the orientation of the circuit is to approach the positive rail so the negative excursion is simple to peak detect. A voltage to current converter of Q80 and R60 converts the signal at Xin to a current. The signal Xout is converted into a current by voltage to current converter including Q81 and R61.

In FIG. 11, one of four selectable voltage to current converters includes Q101/R62, or Q102/R63, or Q103/R64, or Q104/R65. These devices are made of integer multiples of unit elements to provide a highly deterministic relationship in the voltage to current gain between the transistors Q101 through 104 and the average detecting voltage converters Q80, Q81. In the averaging portion of the circuit, the output currents from Q80 and R60 and Q81 and R61 go through a current mirror of Q82 and Q111. In this example, the gain of that mirror is one-half. The device Q82 in FIG. 11 provides a summing function, and its output current is applied to Q111. Q111 is the output current source of the current mirror, and that current is applied to transistor Q112 and resistors R68 and R69. The selectable gain peak detected signal path goes through the current mirror Q100 and Q105, with a gain of one-half and applied to twice the impedance of the voltage to current converter. That resistance is realized using Q106, R66 and R67. The dominant pole of the circuit is realized with capacitor C2. The comparator/differential amplifier includes transistors Q107, Q110, Q108, Q109, and bias current generator Q113. The output voltage IGM is re-referenced to the negative rail and then applied to the gate of the NMOS device in the PMOS amplifier Pierce configuration (FIG. 4) thereby altering the gain of the amplifier such that the amplitude of the difference between Xin and Xout is controlled.

In FIG. 11, N-channel transistor Q80 receives at its gate the crystal signal Xin and has its source coupled to ground through resistor R60 and its drain coupled with the drain of N-channel transistor Q81. Transistor Q81 has its gate coupled with the crystal signal Xout and its source coupled with ground through resistor R61. P-channel transistor Q82 has its source coupled with the supply Vpower and its gate and drain coupled together and also coupled with the drains of transistors Q80, Q81. N-channel transistor Q83 has its drain coupled with the supply Vpower, its gate coupled with the crystal signal Xin, and its source coupled with node N1 which is coupled with the gate of transistor Q87 and the drain of transistor Q85. N-channel transistor Q84 has its drain coupled with the supply Vpower, its gate coupled with the crystal signal Xout, and its source coupled with the node N2 which is coupled with the gate of transistor Q88 and the drain of transistor Q86. N-channel transistors Q85, Q86 each have their gates coupled with the N bias signal, their sources coupled with ground, and the drain of transistor Q85 coupled with node N1 while the drain of transistor Q86 is coupled with the node N2.

P-channel transistor Q87 has its gate coupled with node N1, and its drain coupled with the drain of transistor Q88. Both transistors Q87, Q88, and Q91 each have their sources coupled with the drain of transistor Q92 at node N8.

The drain of P-channel transistor Q88 is coupled with the drain of transistor Q87, and the gate of transistor Q88 is coupled with the node N2. N-channel transistor Q89 has its drain coupled with the drain of transistor Q88 at node N7, and the gate of transistor Q89 is coupled with the gate and drain of transistor Q90 and the drain of transistor Q91. The sources of transistors Q89, Q90 are both coupled with ground. P-channel transistor Q91 has its drain coupled with the drain and gate of transistor Q90, and the gate of transistor Q91 is coupled with the source of transistor Q93 and the drain of transistor Q96 at node N4.

P-channel transistor Q92 has its source coupled with the supply Vpower, its drain coupled with node N6, and its gate coupled with the P bias signal. N-channel transistor Q93 has its drain coupled with the supply Vpower, its gate coupled with the node labeled "HOLD" and its source coupled with node N4 which is coupled with the gate of transistor Q91 and the drain of transistor Q96. P-channel transistor Q94 has its source coupled with the supply Vpower, its gate coupled with the P bias signal, and its drain coupled with the HOLD node. N-channel transistor Q95 has its drain coupled with the HOLD node, its gate coupled with the gates of transistor Q89, Q90, and its source coupled with ground. N-channel transistor Q96 has its drain coupled with node N4, its source coupled with ground, and its gate coupled with the N bias signal. N-channel transistor Q97 has its source coupled with ground, its gate coupled with the power-down signal PD and its drain coupled with the HOLD node. In one example, the HOLD node is coupled with the output of the multiplexer IC2, and a capacitor C1 is coupled between the HOLD node and ground.

The gate and drain of transistor Q100 are coupled with the gate of P-channel transistor Q105 which has its source coupled with the supply Vpower.

At the inputs to the multiplexer IC2, a transistor/resistor is coupled with each of the four inputs in this example. Specifically, N-channel transistors Q101, Q102, Q103, and Q104 each have their drains coupled with the gates of transistors Q100, Q105, and the drains of transistor Q100. The sources of transistors Q100, Q102, Q103, and Q104 are each coupled with ground through resistors R62, R63, R64, R65, respectively. The gates of transistors Q101, Q102, Q103 and Q104 are each coupled with one of the inputs to the multiplexer IC2. The operation of these transistors Q101–Q104 and their affect on the operation of the overall circuit as they are selected will be described in greater detail below.

N-channel transistor Q106 has its source coupled with ground through resistors R66 and R67, and its gate coupled with its drain at node N10 which is coupled with the drain of transistor Q105, the gate of transistor Q107, and ground through capacitor C2. N-channel transistor Q107 has its drain coupled with the gate and drain of transistor Q108 which is coupled with the IGM signal. The source of transistor Q107 is coupled with the source of transistor Q110 at node N11 and is coupled with the drain of transistor Q113. P-channel transistor Q108 has its source coupled with the supply Vpower, and its gate and drain coupled with the IGM signal. P-channel transistor Q109 has its source coupled with the supply Vpower and its gate and drain coupled together with the drain of N-channel transistor Q110. N-channel transistor Q110 has its source coupled with node N11, and its gate coupled with node N12 which is coupled between the drains of transistors Q111 and Q112. P-channel transistor Q111 has its source coupled with the supply Vpower, its gate coupled with the drains of transistors Q80, Q81, Q82, and the gate of Q82, in one example. The drain of transistor Q111 is coupled with the drain and gate of N-channel transistor Q112. The source of transistor Q112 is coupled with ground through resistors R68, R69. N-channel transistor Q113 has its drain coupled with node N11, its source coupled with ground, and its gate coupled with the N bias signal. N-channel transistor Q114 has its gate coupled with the N bias signal, its source coupled with ground, and its drain coupled with the source of N-channel transistor Q115. Transistor Q115 has its gate coupled with ground, and its drain coupled with the IGM signal.

In operation of the example of FIG. 11, the signals Xin and Xout are applied to two voltage to current converters whose outputs are summed. In the case that the DC voltage at Xin and Xout is identical, the output from the current mirror formed by Q82 and Q111 will be a DC current. Simultaneously the signals at Xin and Xout pass through level shifting transistors Q83 and Q84 to be applied to a peak detector realized with components Q87 through Q95 including two current sources Q92 and Q94. This peak detector captures the maximum peak excursion from VPOWER down towards ground, which is the reason why Q95 is an NMOS device (instead of a source follower). This allows the HOLD node to go all the way to ground maintaining a linear relationship at the HOLD node between the peak excursion of Xin or Xout to ground or both if they are symmetrical. The HOLD voltage is then passed through a series of pass gates controlled by the logic in FIG. 11, inverters I20, I21, and gates NOR 20–23 and inverters I22 through I25. That selects one of four voltage to current ratios in this example, and it is the selectable voltage to current gain which allows a user to set the amplitude of the signal across the crystal so that larger signals for better noise performance could be chosen, or smaller signals to improve crystal lifetime could be selected.

The voltage to current converter comprised of Q101 through Q104 is then applied to a current mirror formed by transistors Q100 and Q105 with a gain of one-half in this example, and then that appears across a combination of transistors and resistors which is designed in this example to be identical to Q80 and R60, or Q81 and R61, times a factor of 2. The one-half in the current path and the 2× in the voltage to current converter is chosen such that a smaller capacitor C2 can be used to make the dominant pole of the circuit. The gate voltage of Q107 is compared to the gate voltage of Q110 (node 12) and the difference between those voltages sets the relationship between the output current in diodes Q108 and Q109 with the diode potential across Q108 used to produce a control voltage to the oscillator circuit (FIG. 4).

Embodiments of the present invention provide amplitude regulation in an all-integrated, ratio controlled, flexible circuit solution. The circuit converts the input potentials, and the peak detected value derived from the input potentials, to current, and then back to voltage, allowing device ratios to determine the regulation level and allows digital selectabilty of regulation level and loop gain.

Embodiments of the present invention can be used in a variety of devices where crystal oscillators are used, including but not limited to, integrated circuits, semiconductors, communication devices, programmable logic, microprocessors, microcontrollers, clock circuits, battery powered applications, as examples.

It is understood that while the various aspects of the particular embodiment set forth herein has been described in detail, the present invention could be subject to various changes, substitutions, and alterations without departing from the spirit and scope of the invention. The particular voltage levels described herein could be changed to different voltage levels, depending on the particular application and processing technologies involved.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

It should be appreciated that reference throughout this specification to "one embodiment" or "an embodiment" or "one example" or "an example" means that a particular feature, structure or characteristic described in connection with the embodiment may be included in at least one embodiment of the present invention. Therefore, it should be appreciated that two or more references to "an embodiment" or "one embodiment" or "an alternative embodiment" or "one example" and "an example" in various portions of this specification are not necessarily all referring to the same embodiment. Furthermore, the particular features, structures or characteristics may be combined as desired in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed inventions require more features than are expressly recited in each claim. Rather, as the following claims reflect, inventive aspects lie in less than all features of a single foregoing disclosed embodiment, and each embodiment described herein may contain more than one inventive feature.

While the invention has been particularly shown and described with reference to embodiments thereof, it will be understood by those skilled in the art that various other changes in the form and details may be made without departing from the spirit and scope of the invention.

What is claimed is:

1. A circuit for controlling the amplitude of oscillation of a crystal, comprising:
    a peak detector detecting a peak signal from the crystal, the peak detector providing a voltage output;
    a first voltage-to-current converter coupled with the voltage output of the peak detector, the first voltage-to-current converter providing a peak output current;
    a first current-to-voltage converter coupled with the first voltage-to-current converter, the first current-to-voltage converter providing a first output voltage;
    an input for a reference voltage signal;
    a second voltage-to-current converter coupled with the reference voltage signal, the second voltage-to-current converter providing a reference output current;
    a second current-to-voltage converter coupled with the second voltage-to-current converter, the second current-to-voltage converter providing a second output voltage; and
    an amplifier receiving the first and second output voltages, the amplifier having a control output that is proportional to the difference between the first and second output voltages, the control output for controlling the amplitude of oscillation of the crystal.

2. The circuit of claim 1, wherein the reference voltage signal is derived from the crystal.

3. The circuit of claim 2, wherein the reference voltage signal is a selected from two or more reference signals.

4. The circuit of claim 3, further comprising:
    logic for selecting the reference voltage from the two or more reference signals.

5. The circuit of claim 4, wherein the logic includes a multiplexer for selecting the reference voltage from the two or more reference signals.

6. The circuit of claim 1, wherein a ratio between a size of first voltage-to-current converter and a size of the second voltage-to-current converter is used to control a gain of the circuit.

7. The circuit of claim 1, wherein a ratio between a size of the first current-to-voltage converter and a size of the second current-to-voltage converter is used to control a gain of the circuit.

8. The circuit of claim 1, wherein a ratio between a size of first voltage-to-current converter, a size of the second voltage-to-current converter, a size of first current-to-voltage converter, and a size of the second current-to-voltage converter is used to control a gain of the circuit.

9. The circuit of claim 1, further comprising:
    a first current mirror coupled between the first voltage-to-current converter and the first current-to-voltage converter.

10. The circuit of claim 1, further comprising:
    a second current mirror coupled between the second voltage-to-current converter and the second current-to-voltage converter.

11. A method of controlling the amplitude of oscillations of a crystal in an oscillator,
    detecting a peak signal from the crystal to produce a peak voltage output;
    converting the peak voltage output to a peak output current;
    converting the peak output current to a first output voltage;
    converting a reference voltage signal to a reference output current;
    converting the reference output current to a second output voltage; and
    applying the difference between the first and second output voltages to control the amplitude of oscillation of the crystal.

12. The method of claim 11, further comprising:
    deriving the reference voltage signal from the crystal.

13. The method of claim 11, further comprising:
    selecting the reference voltage from two or more reference signals.

14. The method of claim 11, further comprising:
establishing a ratio between a size of first voltage-to-current converter and a size of the second voltage-to-current converter to control a gain of the circuit.

15. The method of claim 11, further comprising:
establishing a ratio between a size of first current-to-voltage converter and a size of the second current-to-voltage converter is used to control a gain of the circuit.

16. The method of claim 11, further comprising:
establishing a ratio between a size of first voltage-to-current converter, a size of the second voltage-to-current converter, a size of first current-to-voltage converter, and a size of the second current-to-voltage converter is used to control a gain of the circuit.

17. A circuit for controlling the amplitude of oscillation of a crystal, comprising:
a peak detector;
a first voltage-to-current converter;
a first current-to-voltage converter coupled with the first voltage-to-current converter;
a second voltage-to-current converter;
a second current-to-voltage converter coupled with the second voltage-to-current converter; and
a differential amplifier;
wherein a ratio between a size of the first voltage-to-current converter and a size of the second voltage-to-current converter is used to control a gain of the circuit.

18. The circuit of claim 17, wherein the reference voltage signal is derived from the crystal.

19. The circuit of claim 18, wherein the reference voltage signal is a selected from two or more reference signals.

20. The circuit of claim 17, further comprising:
a first current mirror coupled between the first voltage-to-current converter and the first current-to-voltage converter.

* * * * *